(12) United States Patent
Lee et al.

(10) Patent No.: US 7,159,161 B2
(45) Date of Patent: Jan. 2, 2007

(54) TEST METHOD AND ARCHITECTURE FOR CIRCUITS HAVING INPUTS

(75) Inventors: Kuen-Jong Lee, Tainan (TW); Jih-Jeen Chen, Tainan (TW); Cheng-Hua Huang, Tainan (TW)

(73) Assignee: National Science Council, Taipei (TW)

( * ) Notice: Subject to any disclaimer, the term of this patent is extended or adjusted under 35 U.S.C. 154(b) by 613 days.

(21) Appl. No.: 10/441,691

(22) Filed: May 19, 2003

(65) Prior Publication Data

US 2004/0153921 A1    Aug. 5, 2004

Related U.S. Application Data

(63) Continuation-in-part of application No. 09/458,839, filed on Dec. 13, 1999, now abandoned.

(30) Foreign Application Priority Data

Jan. 29, 1999    (TW) .................................. 88101421

(51) Int. Cl.
  *G01R 31/28*    (2006.01)
(52) U.S. Cl. ..................................... 714/738; 714/726
(58) Field of Classification Search ................ 714/722, 714/727, 729, 736, 726, 738; 365/201, 230.01
  See application file for complete search history.

(56) References Cited

U.S. PATENT DOCUMENTS

| | | | |
|---|---|---|---|
| 4,782,486 A * | 11/1988 | Lipcon et al. .............. | 714/722 |
| 5,029,330 A | 7/1991 | Kajigaya | |
| 5,065,090 A | 11/1991 | Gheewala | |
| 5,329,533 A * | 7/1994 | Lin ............................ | 714/727 |
| 5,535,164 A | 7/1996 | Adams et al. | |
| 5,592,493 A * | 1/1997 | Crouch et al. .............. | 714/729 |
| 5,689,466 A | 11/1997 | Qureshi | |
| 5,862,152 A | 1/1999 | Handly et al. | |
| 5,946,246 A | 8/1999 | Jun et al. | |
| 5,970,013 A * | 10/1999 | Fischer et al. ......... | 365/230.01 |
| 5,995,731 A | 11/1999 | Crouch et al. | |
| 6,028,983 A | 2/2000 | Jaber | |
| 6,195,775 B1 | 2/2001 | Douskey et al. | |
| 6,853,597 B1 * | 2/2005 | Jain .......................... | 365/201 |
| 6,961,273 B1 * | 11/2005 | Boldt et al. ................. | 365/201 |
| 6,988,232 B1 * | 1/2006 | Ricchetti et al. ............ | 714/736 |
| 6,996,758 B1 * | 2/2006 | Herron et al. .............. | 714/726 |

OTHER PUBLICATIONS

Zhang, Zaifu et al., "An Efficient Multiple Scan Chain Testing Scheme", 1996 IEEE, pp. 294-297.
Narayanan, Sridhar et al., "Asynchronous Multiple Scan Chains", 1995 IEEE, pp. 270-276.

* cited by examiner

*Primary Examiner*—David Ton

(57) ABSTRACT

A test method for a plurality of circuits respectively having inputs for greatly reducing the required test time and the control circuit complexity is provided. The method includes steps of providing a set of test patterns for detecting a characteristic of the circuits, providing a common data line, and electrically connecting the circuit inputs to the common data line so that the test pattern can be broadcasted to the circuits through the common data line. The present invention also provides an architecture for implementing such method.

29 Claims, 10 Drawing Sheets

TEST METHOD AND ARCHITECTURE FOR CIRCUITS HAVING INPUTS

FIELD OF THE INVENTION

The present invention relates to a test method or architecture, and more particularly to one for circuits having inputs.

BACKGROUND OF THE INVENTION

The scan based design is one of the most acceptable methods in the industry for testable design, and is mainly aimed in greatly reducing the complexity of the automatic test pattern generation (ATPG) process. When a scan chain includes too many scan elements, however, the required test time will be relatively long. Although the multiple scan chain design is one of measures which can effectively decrease the test time that the scan type circuit requires, the control circuit therefor normally is more complex than that for the single scan chain design and the required additional pin number will proportionally increase with the number of the scan chains.

S. Narayanan et al. disclosed in the article entitled "Asynchronous Multiple Scan Chains" for IEEE VLSI Test Symposium in 1995 that multiple scan chains are respectively grouped and the sequence of the schedule of test sessions is changed, in order to decrease the required test time, which, nevertheless, must be supported by multiple input/output lines.

In order to cope with the above situation, numerous modifications to the conventional multiple scan chain architecture were proposed. As an example, Z. Zhang et al. disclosed in the article entitled "An Efficient Multiple Scan Chain Testing Scheme" for Sixth Great Lakes Symposium on VLSI in 1996 cellular automata (CA) to serve as the required test pattern generator for tested circuits of different properties in order to overcome the linear dependency problem in test patterns. Since the control signal needs a multiplexer to select among the multiple scan chains, burdons on hardware and timing are increased.

For the present board level test, the boundary scan has become one of the compulsory test strategies. Since the present peripheral scan architecture only permits a data input line and a data output line, it cannot effectively support the multiple scan chain test design. This problem can be overcome by utilizing the demultiplexer to input the required test pattern from the single data line in time-division to respective scan chains, which can support the peripheral scan architecture but will increase the overall test time.

SUMMARY OF THE INVENTION

The present invention includes a method to resolve the above problems and an architecture to implement the invented method. The invention allows the use of one single input to provide test data to multiple scan chains of a plurality of circuits while the test time is still very close to that for the conventional multiple scan chain techniques. The fault coverage with the present invention is the same as that using a single scan chain or multiple scan chains but the required test volume of the present invention is much less than the single or multiple scan methods. A virtual circuit construction technique is invented that can assist the automatic test pattern generation procedure to generate the common test patterns that can be broadcast to all circuits under test with no fault coverage loss. Since only one data input is required to provide test input data, the present invention can be easily applied to the boundary scan technique, which is a widely-accepted industry standard for chip level test interface, also known as IEEE Std. 1149.1. The invention can be applied to both combinational or sequential circuits. For combinational circuits it is assumes that the inputs of the combinational circuits can be chained together to form a scan chain and hence the required test input data can be scanned in. For sequential circuits, the internal storage elements are assumed to be constructed into scan chains while the inputs can either be a part of the scan chains or remain as primary inputs without scan chains to chain them together.

More specifically, the present invention, which provides a test method for a plurality of circuits respectively having inputs, includes providing a test information for detecting a characteristic of said plurality of circuits; providing a common data line; electrically connecting said common data line to said inputs of said plurality of circuits so that said test information can be broadcast to said plurality of circuits simultaneously through said common data line; providing a test generation method to generate the said test information wherein said plurality of circuits are configured into a virtual circuit prior test generation procedure such that a software type automatic test pattern generator can be used to generate said test information for the said plurality of circuits simultaneously; and providing a test result compression method to compress the test results.

Preferably the test information is a set of test patterns.

Generally the common data line is a data input line, and each of the plurality of circuits includes a plurality of input lines.

Certainly, the plurality of circuits can have the same number of the input lines. Alternatively, a number of the input lines of one of the plurality of circuits can be different from that of the input lines of another of the plurality of circuits.

Preferably the test pattern is broadcast to the plurality of circuits through the common data line. The characteristic can be a detectable fault.

As for the output results, the said compression method can be implemented by any available compression technique, with preferably the commonly used signature analysis method.

It is an object of the present invention to provide a test method and an architecture for circuits having inputs.

According to the present invention, a test method for a plurality of circuits respectively having inputs includes providing a test information for detecting a characteristic of the plurality of circuits; providing a common data line; electrically connecting the common data line to the inputs of the plurality of circuits so that the test information can be broadcast to the plurality of circuits simultaneously through the common data line; providing a test generation method to generate the test information wherein the plurality of circuits are configured into a virtual circuit-prior test generation procedure such that a software type automatic test pattern generator can be used to generate the test information for the plurality of circuits simultaneously; and providing a test result compression method to compress the test results.

Preferably, the plurality of circuits can be a number of independent circuits or a number of independent modules in a large circuit.

Preferably, a characteristic is a detectable fault.

Preferably, the test information is a set of test patterns.

Preferably, the common data line is a data input line.

Preferably, each of the plurality of circuits includes a plurality of input lines.

Preferably, each of the input lines of each circuit can be connected to the output of a storage element.

Preferably, the storage element is preferably a scan flip-flop.

Preferably, the storage elements connecting the inputs of each circuit are connected in series to form a scan chain.

Preferably, the said common data line is electrically connected to the inputs of the plurality of circuits via physically connecting the common data line to the inputs of the scan chains for the plurality of circuits.

Preferably, the virtual circuit is formed by connecting the inputs of the plurality of circuits in a one-to-one manner.

Preferably, the one-to-one manner is carried out by connecting one input from each circuit to form one input of said virtual circuit, wherein all inputs of the plurality of circuits are connected to some inputs of the virtual circuit with each input of each circuit is connected to the exactly one input of the virtual circuit.

Preferably, the one-to-one manner can be preferably carried out by connecting the first input lines of the plurality of circuits together to form the first input of the virtual circuit, the second inputs lines of the plurality of circuits together to form the second input of the virtual circuit.

Preferably, the virtual circuit is processed by the automatic test pattern generation procedure to generate the test information for the plurality of circuits simultaneously.

Preferably, the test information generated through the virtual circuit has a fault coverage equal to the best fault coverage that can be achieved for the respective plurality of circuits when they are tested individually.

Preferably, the required number of bits to store the test information is much smaller than that required for testing all the plurality of circuits individually.

Preferably, the plurality of circuits outputs therethrough test result data when the test information is applied to the plurality of circuits through the common data line.

Preferably, the test result compression method comprises a multiple input signature register electrically connected to the outputs of the plurality of circuits.

Preferably, the test result compression method further comprises a plurality of multiple input signature registers respectively electrically connected between the outputs of the plurality of circuits.

Preferably, the test information is broadcasted to the plurality of circuits through the common data line.

According to another aspect of the present invention, a test circuit architecture comprises a plurality of circuits having a characteristic and input lines; and a common data line electrically connected to said input lines for providing therethrough a test information for detecting the characteristic of the plurality of circuits.

Preferably, the test circuit architecture further comprises a common output line electrically connected to said plurality of circuits for obtaining output data therethrough.

Preferably, the common output line outputs therethrough test result data.

Preferably, the input lines of a first one of the plurality of circuits electrically connect one by one thereto the input lines of the rest of the plurality of circuits.

Preferably, the plurality of circuits are such grouped together that the sum of the input lines of each respective group is approximate to but no larger than the number of the input lines of a specific one of the plurality of circuits having the largest input line number thereamong.

Preferably, the test circuit architecture further comprises a plurality of scan chains respectively electrically connected between the data line and the plurality of circuits.

Preferably, the input lines, of the plurality of circuits, of the same order are electrically connected together.

Preferably, the input lines of a first one of the plurality of circuits are respectively electrically connected one by one to the input lines of a specific one of the plurality of circuits having the largest input line number thereamong; and the input lines of a further one of the plurality of circuits are respectively electrically connected one by one to the rest of the input lines of the specific circuit if the number of the input lines of the further circuit is smaller than or equal to that of the rest input lines of the specific circuit, repetitively, until the number of the input lines of said further circuit is larger than that of the rest input lines of the specific circuit.

Preferably, the test information is broadcasted to the plurality of circuits through the common data line.

Preferably, the test information is a set of test patterns.

The present invention may best be understood through the following descriptions with reference to the accompanying drawings, in which:

DETAILED DESCRIPTION OF THE PREFERRED EMBODIMENT

The present invention is based on the recognition that upon proceeding the automatic test pattern generation (ATPG), a replacing test pattern optimally taking advantages of compatibilities of required test patterns of respective circuits without a lowered fault coverage is obtained. This differs from the conventional test pattern compression technique in that the former compression technique is directed to handle a single tested circuit whereas the present invention aims to deal with a plurality of tested circuits obtaining test data through a single data line. In order to better interpret the present invention, we use two tested circuits 1 and 2.

In the beginning of proceeding the automatic test pattern generation, a random test pattern is used to detect the fault until a certain fault coverage is reached. After most of faults are detected by the random test pattern, a deterministic test pattern is specially provided to deal with the rest detectable faults. If test patterns being random before the $k^{th}$ (included) and being deterministic after the $(k+1)^{th}$ (included) are used for tested circuit 1, the former k random test patterns are also random for and can thus be used in tested circuit 2. Since the deterministic test pattern is specifically used for the special fault, it might contain many Don't Care bits. As an example, if most faults in tested circuit 1 are tested by former random k test vectors, test vectors after the $(k+1)^{th}$ (included) might contain therein many Don't Care bits which might be unable to detect any more faults in tested circuit 1 regardless of their logical values.

Nevertheless, if we designate, for the purpose of detecting faults in tested circuit 2, specific logical values for Don't Care bits in test vectors after the $(k+1)^{th}$ in tested circuit 1, faults in tested circuit 2 can be additionally detected in addition to the detection of the original faults. Specifically, if tested circuits 1 and 2 are independent of each other, those Don's Care bits designated with specific logical values might not be able to detect further faults in tested circuit 1 but could detect more faults in tested circuit 2.

Accordingly, either randomly or deterministically generated test vectors can both be shared for use by tested circuits 1 and 2, which enlightens the inventors on the present invention that upon proceeding the vector generation, the same test vector will be valid for all tested circuits if all the scan chains are electrically connected to the same input control line. Thus, when the test procedure is actually initiated, the same test vector can be easily broadcast to all tested circuits.

Figure 1:
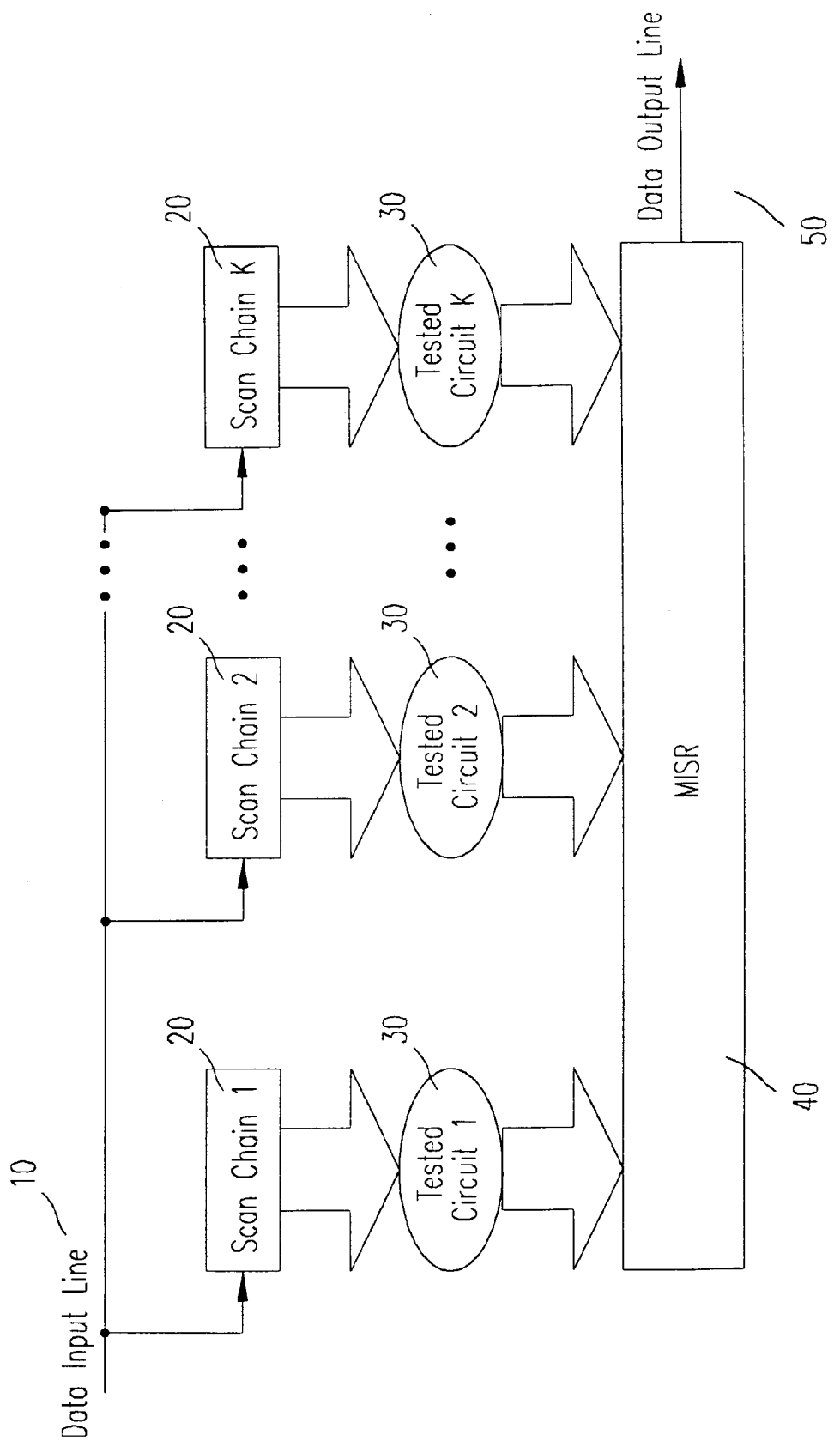
FIG. 1 is a schematic view showing a first architecture for implementing a test method for circuits having inputs according to the present invention.

Referring now to FIG. 1, there is shown a preferred embodiment of a test circuit architecture according to the present invention which includes a plurality of circuits 1, 2 . . . k to be tested (30) having respective detectable faults, a plurality of serial scan chains 1, 2 . . . k (20) respectively electrically connected to circuits (30), a common data input line (10) electrically connected to scan chains (20) for broadcasting therethrough a test pattern for detecting the detectable faults of circuits (30), a multiple input signature register (MISR) (40) electrically connected to circuits (30) for data-compressing the tested result, and a common data output line (50) electrically connected to MISR (40) for obtaining the tested result therethrough for observation.

Since the test pattern is broadcast to all circuits (30), it must cope with the requirements of all circuits (30). To implement the above concept, we hereby recompose the circuits under test before the ATPG process and call the recomposed circuit as the "virtual circuit." It should be pointed out that the virtual circuit does not exist physically but is designed for the ATPG process to generate common test vectors that are effective for all circuits. As above illustrated, we use again tested circuits 1 and 2 respectively having M and N (where $M^3 N$) input lines to explain how the virtual circuit is constructed. N ones from M input lines of tested circuit 1 electrically connect one by one thereto N input lines of tested circuit 2. The rest (M−N) input lines of tested circuit 1, which are not so connected, remain unconnected. If the sequence of input lines of tested circuits 1, 2 is not considered, we will have M!/(M−N)! combinations. Specifically, it is possible for us to construct M!/(M−N)! virtual circuits by using tested circuits 1 and 2. Ideally, we can proceed the ATPG process against those virtual circuits in order to locate the combination requiring the least test pattern but having an acceptable fault coverage.

In proceeding the ATPG, the present overall test circuit architecture can be considered as an integral tested circuit so that the thus generated test pattern through the ATPG processing program will be able to cope with requirements of respective tested circuits (30) simultaneously. Since the virtual circuit differs from the respective tested circuit only in the input end, we thus know the detectable faults in the original respective tested circuit can also be detected in the virtual circuit. Accordingly, the fault coverage will not be lowered, and the fault simulation and the complexity for generating the test pattern both required during the ATPG process will not be increased.

The principle of such architecture can be applied to k (where k>2) tested circuits 1, 2 . . . k (30) where test circuits (30) respectively have input line numbers N1, N2 . . . Nk, in which N1=Max (Ni) where i=1, 2 . . . k. At first, N2 input lines of tested circuit 2 are respectively electrically connected one by one to N2 ones among input lines of tested circuit 1, and N3 input lines of tested circuit 3 are respectively electrically connected one by one to N3 ones among the rest of input lines of tested circuit 1. A similar operation is rendered for the rest tested circuits. As such, a virtual circuit including k tested circuits is obtained. If the sequence of input lines of the tested circuits is not taken into consideration, we will have [N1!/(N1−N2)!]*[N1!/(N1−N3)!]* . . . *[N1!/(N1−Nk)] combinations. Ideally, we can proceed ATPG process for those [N1!/(N1−N2)!]*[N1!/(N1−N3)!]* . . . *[N1!/(N1−Nk)] virtual circuits in order to find out those combinations which require the least test pattern but have acceptable fault coverage.

So far as the present technique for VLSI is concerned, one system normally has tens or hundreds of input/output lines which will multiply possible combinations of virtual circuits which will in turn increase the complexity of obtaining the optimal test pattern and the overall test cost. We will propose hereinafter some practically feasible examples.

Referring back to FIG. 1, since all data from tested circuits (30) are compressed by the same MISR (40), the hardware design complexity for MISR (40) will be increased if tested circuits (30) have a great sum of output lines. On the other hand, since MISR (40) receives all output data from tested circuits (30), the routing length between MISR (40) and tested circuits (30) will be increased as a result of different placements and layouts of respective tested circuits (30).

Figure 2A:
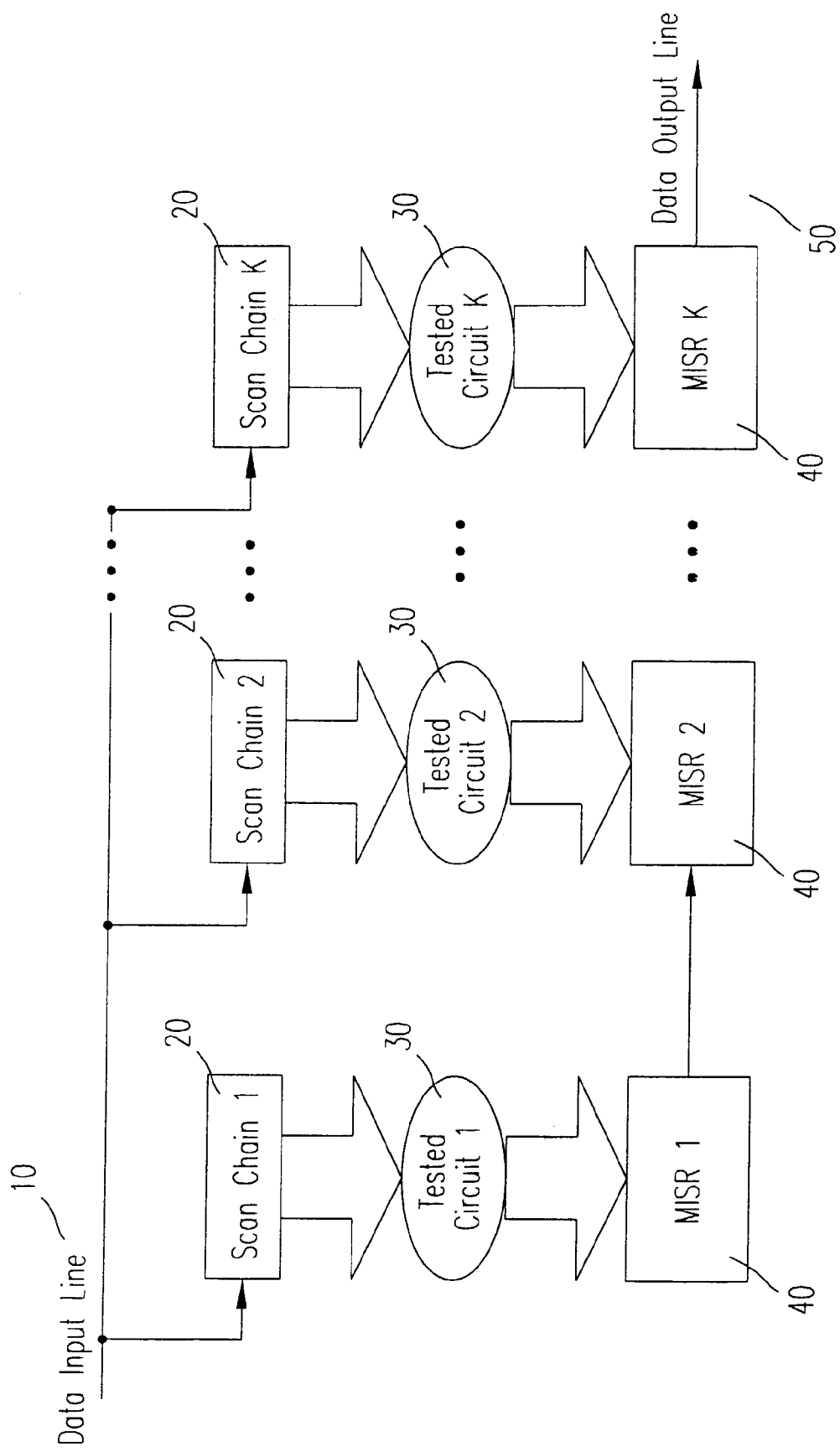
FIG. 2A is a schematic view showing a second architecture using multiple input signature registers (MISRs) for implementing a test method for circuits having inputs according to the present invention.

In order to overcome the above situation, as shown in FIG. 2A, output ends of tested circuits (30) are respectively electrically connected to independent MISR 1, MISR 2 . . . MISR k (40) respectively having flip-flop numbers dependent on output line numbers of corresponding tested circuits (30). Upon proceeding the test procedure, tested circuits (30) respectively compress data in their corresponding MISRs (40). Since all scan chains (20) receive the same test pattern, the test time is the same for all tested circuits (30). After tested, data in MISRs (40) are serially outputted through data output line for observation.

Figure 2B:
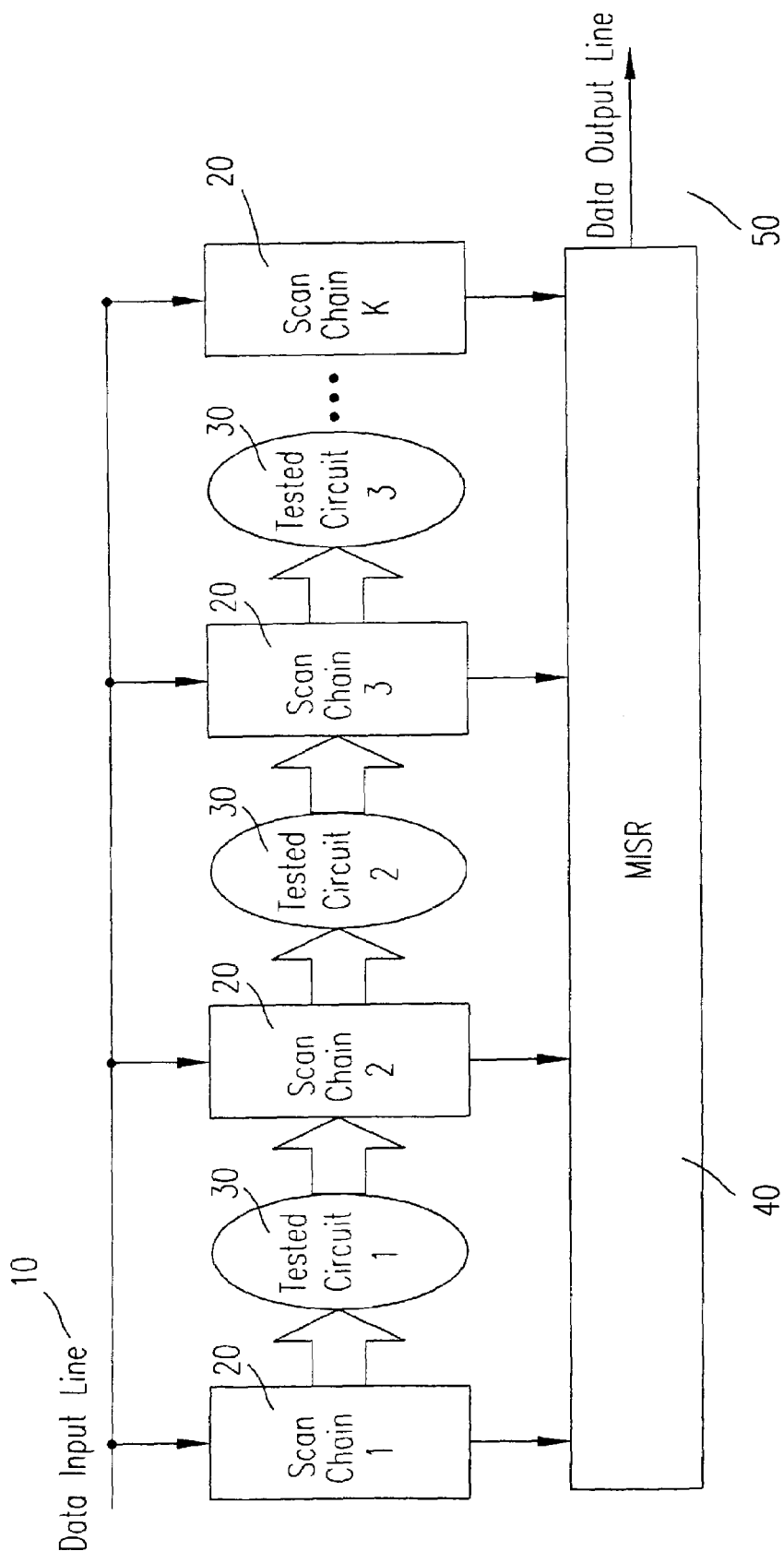
FIG. 2B is a schematic view showing a third self-testing using MISR and parallel SRSG (STUMPS) architecture for implementing a method for circuits having inputs according to the present invention.

As shown in FIG. 2B, the data compression for the present scan test architecture can use a method similar to Self-Testing Using MISR and Parallel SRSG (Shift Register Sequence Generators) (STUMPS) proposed by P. H. Bardell. Specifically, the output of tested circuit 1 is connected to scan chain 2, the output of tested circuit 2 is connected to scan chain 3 . . . and so on. The output ends of scan chains 1, 2 . . . k (20) are connected in parallel to a MISR (40) for signature. With such architecture, not only the required flip-flop number in MISR (40) is reduced, but also it is applicable in a pipeline design structure. Such architecture is clearly different from the STUMPS structure in that the present architecture only uses a single data line in the input end for transmitting the test pattern to all scan chains (20).

Figure 3:
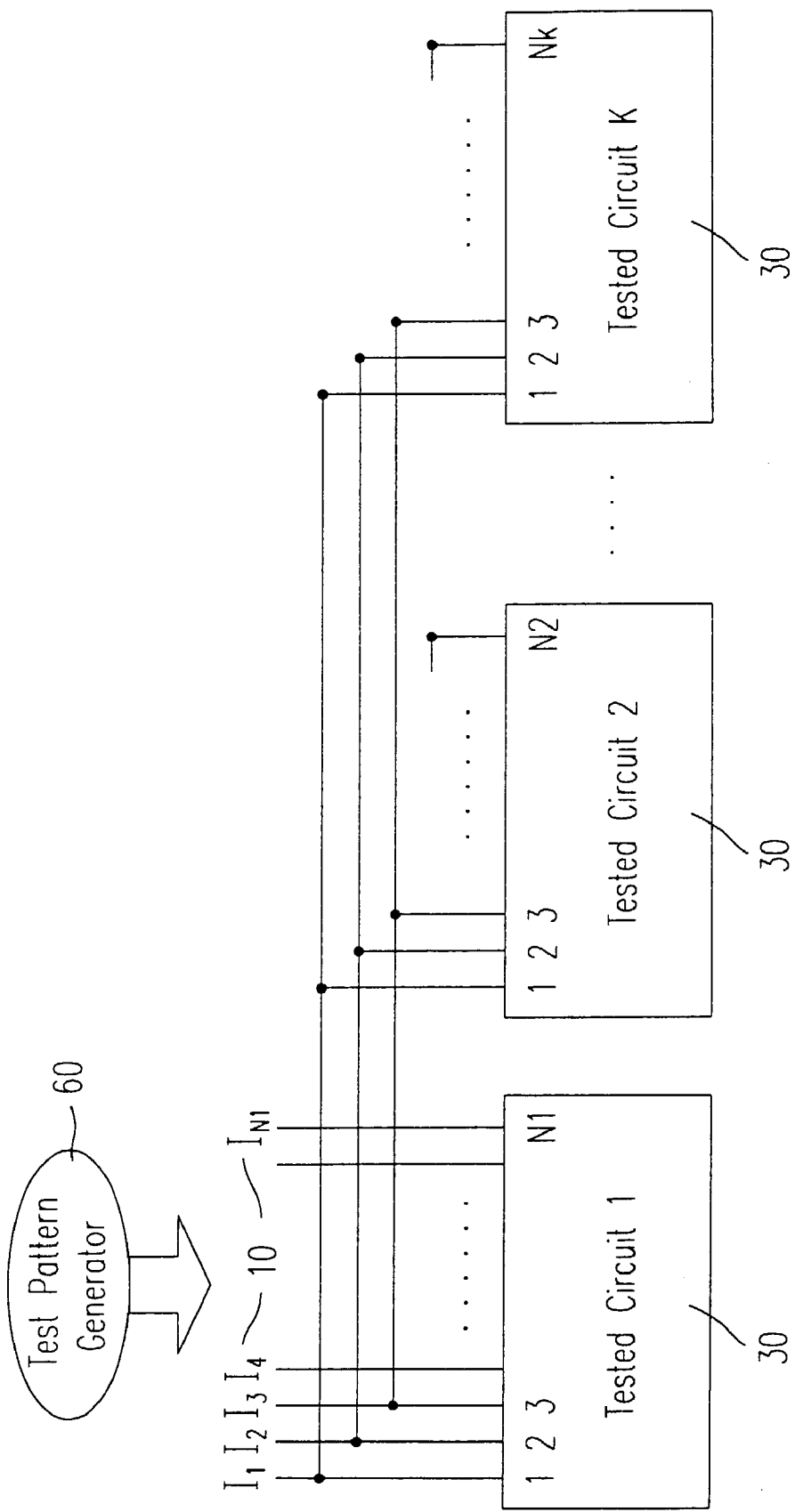
FIG. 3 is a schematic view showing a fourth architecture for implementing a test method for circuits having inputs according to the present invention.
Figure 4:
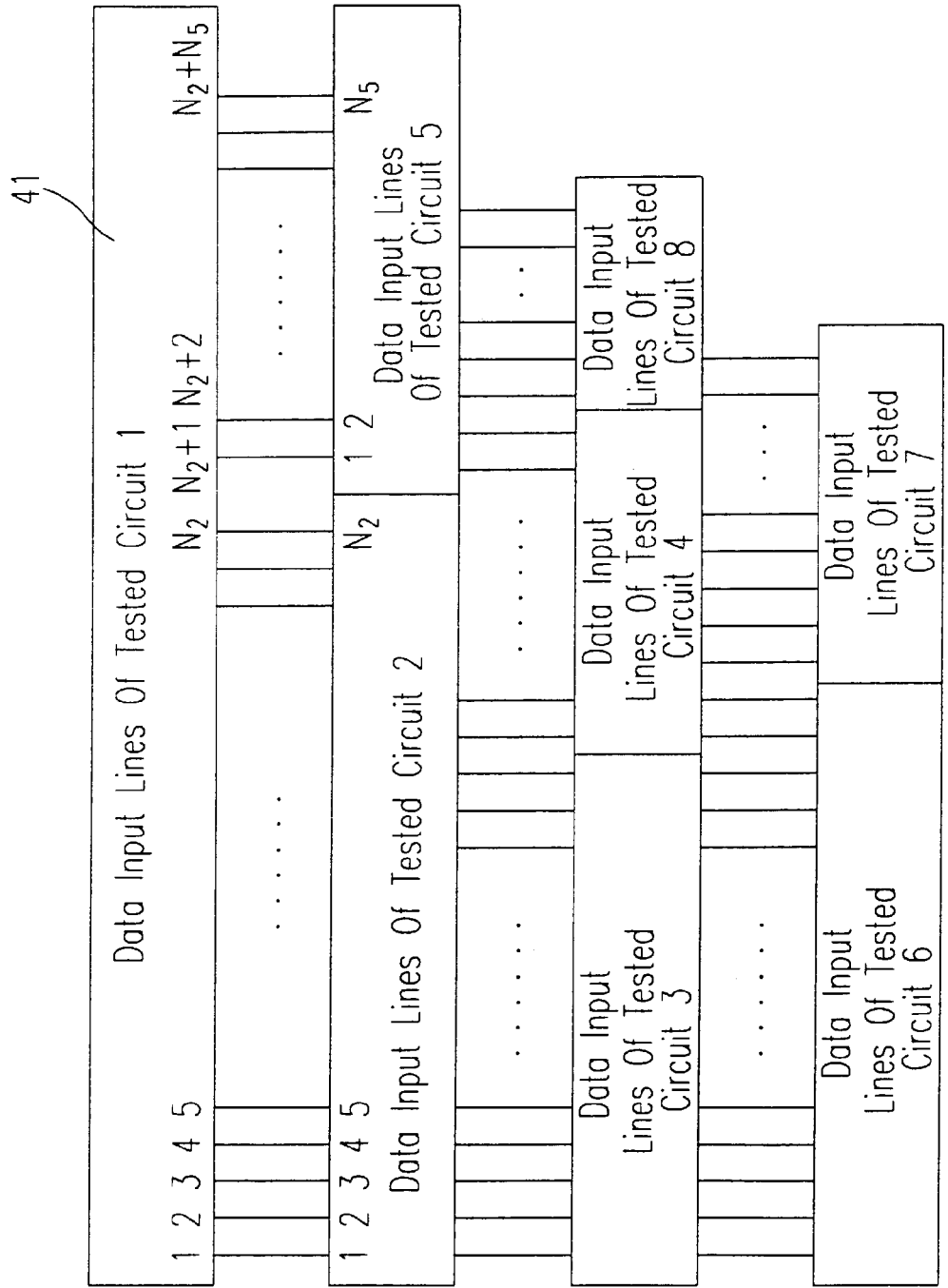
FIG. 4 is a schematic view showing a fifth architecture for implementing a test method for circuits having inputs according to the present invention.

In practical application, as shown in FIG. 3, input lines, of tested circuits (30), of the same order are respectively electrically connected together to respectively form new input lines I1, I2 . . . IN1. If the input line number of a specific tested circuit (30) is less than i, the specific tested circuit (30) needs not be connected to new input line Ii. After all tested circuits (30) are connected in the above manner, a virtual circuit architecture according to the present invention is thus obtained. We can then run the ATPG related program to thus provide an automatic test pattern generator 60 for such architecture to generate the required test pattern. Alternatively, a further architecture according to the present invention is shown in FIG. 4. Without losing the general principle, we assume the number of input lines 41 of tested circuit 1 is the largest among those of tested circuits (30), i.e. N1=Max (Ni) where i=1, 2 . . . k. At first, N2 input lines of tested circuit 2 are respectively electrically connected one by one to N2 ones among input lines of tested circuit 1, and Ni ones of input lines of tested circuit i are respectively electrically connected one by one to Ni ones (normally from N2+1 to N2+Ni) among the rest of input lines of tested circuit 1 if it is determined that Ni is less than or equal to (N1−N2). A similar operation is rendered for the rest tested circuits until the number of the residual input lines of tested circuit 1 is less than that of input lines of any one of tested circuits (30) having not been so connected thereto yet. As shown in FIG. 4, input lines of tested circuit 1 respectively electrically connect thereto both input lines of tested circuits 2 and 5. With similar procedures, tested circuits (30) having not been above-mentioned connected are connected in a similar manner to tested circuit 1. As an example, as shown in FIG. 4, additional tested circuits 3, 4 and 8 as well as 6 and 7 are such respectively grouped together that the sum of input lines of each respective group is approximate to but no larger than the number of input lines of a specific tested circuit (30) (1 in this particular instance) having the largest input line number thereamong. After all tested circuits (30) are likely connected together, we again obtain a virtual circuit architecture according to the present invention. Through the ATPG system, the test pattern for such virtual circuit having 4-group test architecture is obtained.

A further virtual circuit architecture according to the present invention will now be described with reference to FIG. 5. To this end, the following steps are involved:

a) selecting the tested circuit (30) having the largest input line number among tested circuits (30) as tested circuit 1, i.e. N1=max(Ni);

b) electrically connecting together N2 input lines of second tested circuit 2 to N2 ones of input lines of first tested circuit 1 to form a first virtual circuit;

c) proceeding therefor an automatic test pattern generation and recording a first required test pattern result;

d) forming a further virtual circuit by respectively electrically connecting together N2 input lines of second tested circuit 2 to input lines of the same order of first tested circuit 1 by shifting 1 for the order of input lines of first tested circuit 1 each time;

e) proceeding an automatic test pattern generation, recording a further required test pattern result to be compared with the first required test pattern result, and recording a combination having a lesser test pattern number;

f) repetitively proceeding steps d) and e) until the last input line of first tested circuit 1 is electrically connected to the last input line of second tested circuit 2 where the first input line of second tested circuit 2 is connected to (N1−N2+1)$^{th}$ input line of first tested circuit 1;

g) repetitively respectively proceeding steps d), e) and f) for first tested circuit 1 and a higher order one of tested circuits (30) until those respective steps for first tested circuit 1 and the last one (tested circuit k) of tested circuits (30) are proceeded;

h) carrying out a final ATPG process for the present integral virtual tested circuit including tested circuits (30) according to previously obtained k−1 combinations; and i) proceeding therefor an automatic test pattern generation to obtain the required test pattern.

The above-mentioned different connection styles for the present virtual circuit might be implemented in different practical hardware scan chain structures which are to be described hereinafter. Nevertheless, they all share the same design spirit that all tested circuits (30) obtain the test pattern from the same data line in parallel.

Figure 6:
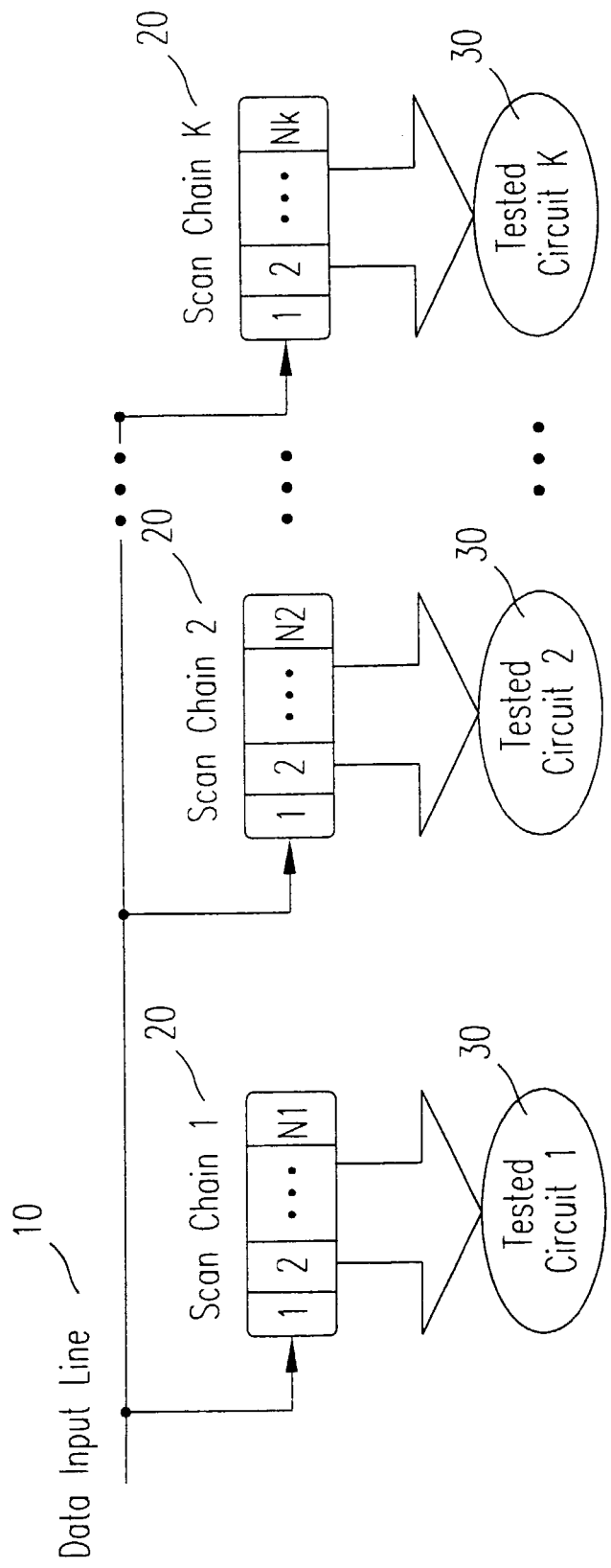
FIG. 6 is a schematic view showing a seventh architecture for implementing a test method for circuits having inputs according to the present invention.

As shown in FIG. 6 showing a hardware scan test structure according to the present invention, all tested circuits (30) receive from the scan input or the data input line (10) the same test pattern requiring N1 clock cycle to be shifted in the scan chain 1 of tested circuit 1. Meanwhile, the former Ni (where i=2, 3 . . . k) bits in the test pattern are shifted in the corresponding scan chain of tested circuit i so that all tested circuits (30) receive the required test pattern. All tested data are compressed through MISR (40) shown in FIGS. 1, 2A and 2B to be shifted out through the data output line or the scan output (50) for observation. As such, a single data line supporting multiple scan chain structure is achieved.

Figure 7:
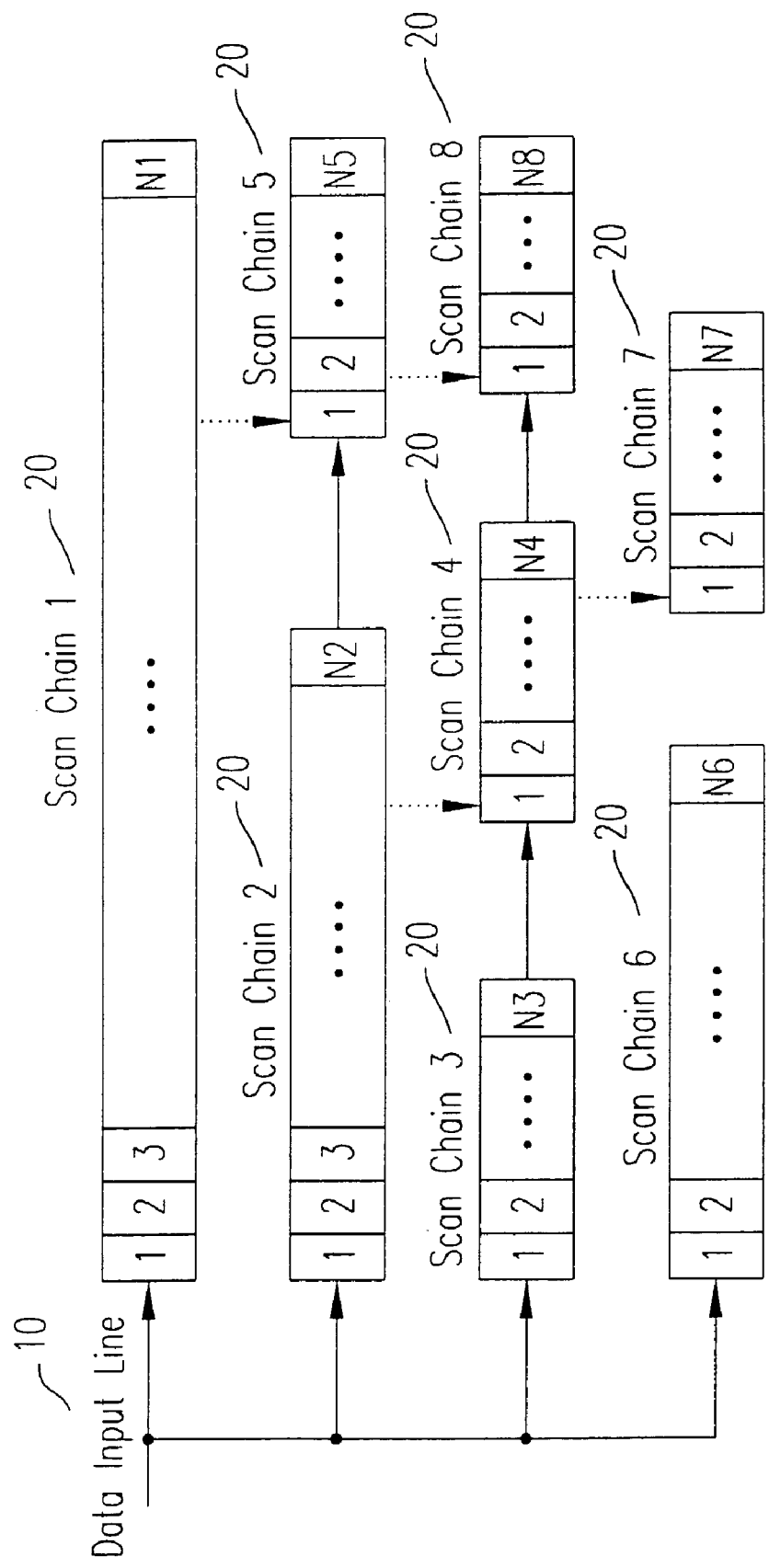
FIG. 7 is a schematic view showing an eighth architecture for implementing a test method for circuits having inputs according to the present invention.

As schematically shown in FIG. 7, in which only portions of scan chains are illustrated for simplicity, showing a further hardware scan test structure according to the present invention, the input line of the first scan register of scan chain 5 can be connected to the output line of the last scan register of scan chain 2 in practical hardware test structure if the first input line of scan chain 5 is connected to the (N2+1)$^{th}$ input line of scan chain 1. Alternatively, the input line of the first scan register of scan chain 5 can be directly connected to the N2 output end of scan chain 1 as shown in dotted line. Similar connections among other scan chains (20) of tested circuits (30) can be similarly effected.

Figure 8:
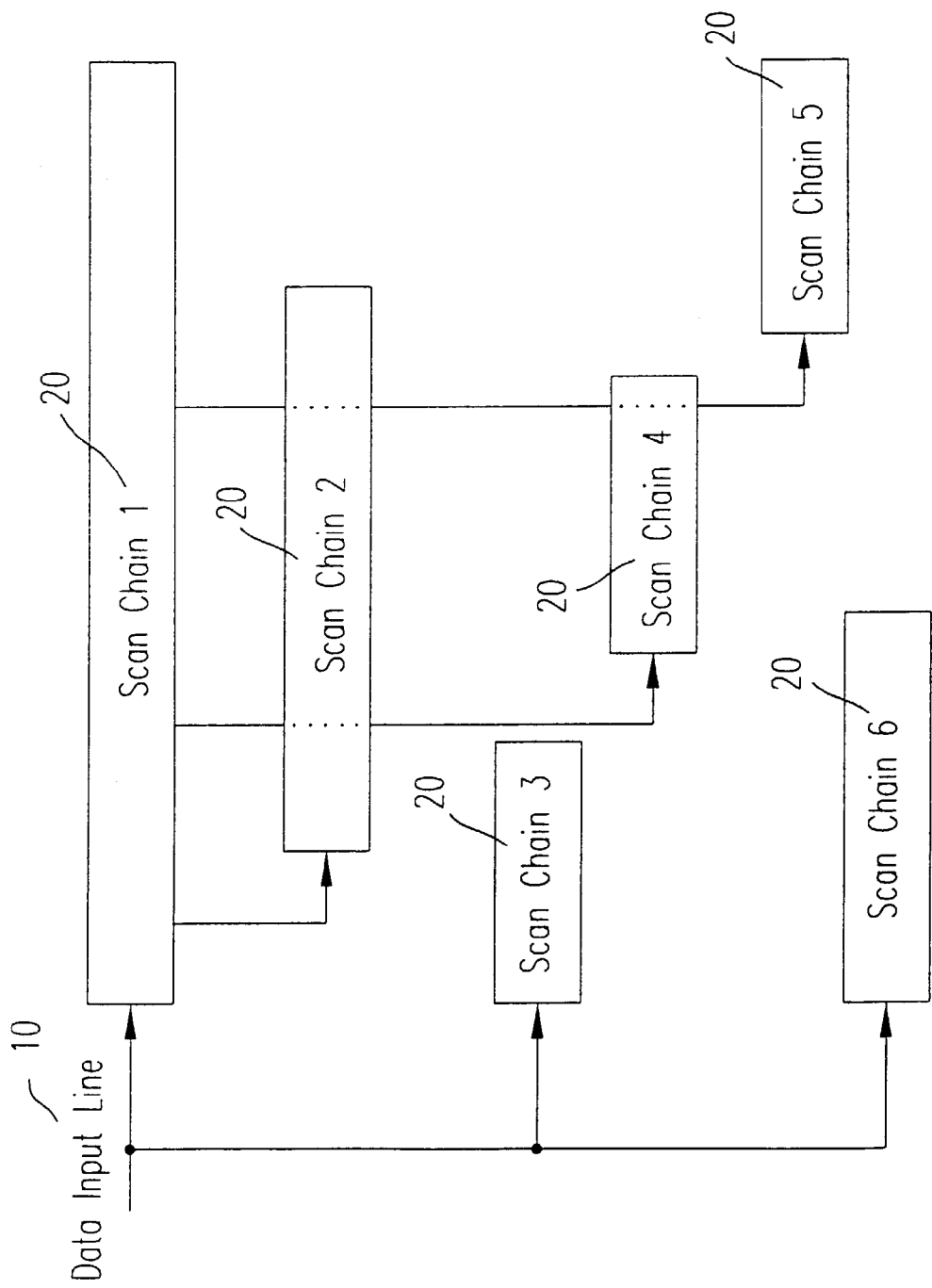
FIG. 8 is a schematic view showing a ninth architecture for implementing a test method for circuits having inputs according to the present invention.

FIG. 8, in which also only portions of scan chains are illustrated for simplicity, schematically shows an additional hardware scan test structure according to the present invention, which is constructed according to k−1 combinations after proceeded with the ATPG procedure. If the best combination or connection position is found to be j for a tested circuit j after tested circuits l and j are subject to the ATPG process, upon implementing the hardware scan design, the input line of the first scan register of tested circuit j is connected to the output line of the (j−1)$^{th}$ scan register of tested circuit 1. If, however, the best connection position between tested circuits 1 and j is found to be 1, the input line of the first scan register of tested circuit j will be directly connected to the scan input or the data input line (10). Such principle is applied to all other tested circuits (30).

Figure 9:
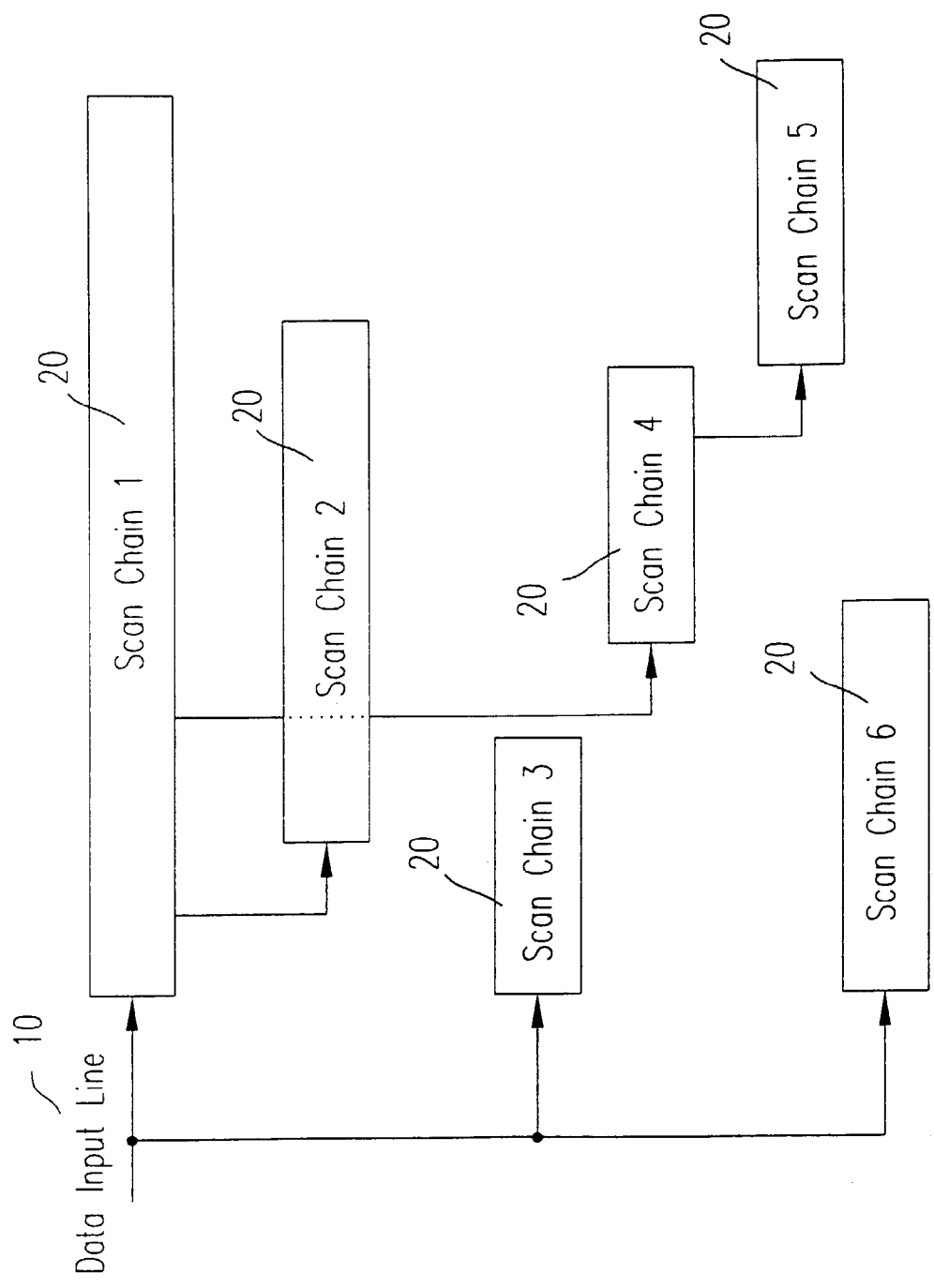
FIG. 9 is a schematic view showing a tenth architecture for implementing a test method for circuits having inputs according to the present invention.

As similarly shown in FIG. 9, if the best connection positions are found to be j4 and j5 respectively after tested circuit 1 and tested circuits 4 and 5 are subject to the ATPG process respectively, the input line of the first scan register of tested circuit 5 can be modified to be connected to the output line of the (j4–j5)$^{th}$ scan register of tested circuit 4 in consideration of the fact that under the practical element arrangement, the distance between tested circuits 1 and 5 is farther than that between tested circuits 1 and 4, in order to shorten the length of routing of the data line.

Accordingly, it can be summarized that a preferred embodiment of a test method for a plurality of circuits (30) respectively having equal or unequal inputs according to the present invention includes the steps of:

providing a test pattern for detecting detectable faults of the plurality of circuits (30);

providing a common data line (10);

providing a plurality of scan chains (20) respectively electrically connected between data line (10) and circuits (30);

electrically connecting the inputs to the common data line (10) so that the test pattern can be broadcast into the plurality of circuits (30) through the common data line (10);

electrically connecting a multiple input signature register (MISR) (40) between the common output line (50) and the circuits (30) for compressing data from circuits (30); and electrically connecting a common output line (50) to MISR (40).

In a virtual tested circuit constructed according to such method, the test pattern has a bit number equal to a largest input line number among the plurality of circuits (30). Also, the virtual tested circuit has a fault coverage equal to the largest fault coverage of the respective tested circuits (30).

With the above-mentioned test architecture and/or test pattern generation method, experiments have been made for all ISCAS'85 (International Symposium on Circuit And System, 1985) combined circuits (C432, C499, C880 . . . C7552). Table 1 tabulates the results for respective ISCAS'85 combined circuits respectively subject to test pattern generation processes, in which column 1 (circuit) shows the circuit name, column 2 (#PI/PO) shows the input/output line numbers, column 3 (#faults) shows the fault number, column 4 (#gates) shows the circuit gate number, column 5 (#RF) shows the redundant fault number or the undetectable fault number, column 6 (#TP) shows the required test pattern number, column 7 (TG time(sec)) shows the time required for proceeding the ATPG process, column 8 (FC%) shows the fault coverage and column 9 (TE%) shows the practical detectable fault percents after deleting the redundant faults. It can be known from this table that it requires 738 sets of test patterns in totality in order to fully detect 31835 (=32342–507) detectable faults in the 10 ISCAS'85 tested circuits, while the time required for proceeding the test pattern generation is 163.2 seconds.

TABLE 1

| Circuit | #PI/PO | #Faults | #Gates | #RF | #TP | TG Time (sec) | FC (%) | TE (%) |
|---|---|---|---|---|---|---|---|---|
| C432 | 36/7 | 524 | 160 | 4 | 43 | 2.4 | 99.24 | 100 |
| C499 | 41/32 | 758 | 202 | 8 | 54 | 2.5 | 98.94 | 100 |
| C880 | 60/26 | 942 | 383 | 0 | 35 | 2.7 | 100 | 100 |
| C1355 | 41/32 | 1574 | 546 | 8 | 86 | 8.3 | 99.49 | 100 |
| C1908 | 33/25 | 1879 | 880 | 9 | 117 | 18.2 | 99.52 | 100 |
| C2670 | 157/64 | 2595 | 1193 | 117 | 71 | 12.2 | 95.49 | 100 |
| C3540 | 50/22 | 3428 | 1669 | 137 | 130 | 39.2 | 96.00 | 100 |
| C5315 | 178/123 | 5350 | 2307 | 59 | 76 | 17.1 | 98.90 | 100 |
| C6288 | 32/32 | 7744 | 2416 | 34 | 29 | 31.8 | 99.56 | 100 |
| C7552 | 206/107 | 7548 | 3512 | 131 | 97 | 28.8 | 98.26 | 100 |
| Total | 834/470 | 32342 | 13268 | 507 | 738 | 163.2 | 97.71 | 100 |

(wherein PI/PO: Primary Input/Output, RF: Redundant Faults, TP: Test Patterns, TG Time: Test Generation Time, FC: Fault Coverage and TE: Test Efficiency)

In order to further examine the present invention, we integrate the above-described 10 ISCAS'85 tested circuits into one circuit system to be tested by various test methods respectively. Table 2 lists test results so made.

TABLE 2

| Test method | Single | Multiple | Method 1 | Method 2 | Method 3 |
|---|---|---|---|---|---|
| Test Efficiency (%) | 100 | 100 | 100 | 100 | 100 |
| #Test Patterns | 130 | 130 | 195 | 177 | 158 |
| Scan Chain Length | 834 | 206 | 206 | 206 | 206 |
| Test Generation Time (sec) | 163.2 | 163.2 | 122.2 | 130.3 | 115.7 |
| Test Application Cycles | 108420 | 26780 | 40170 | 36462 | 32548 |
| Normalized Test Application Cycles | 4.05 | 1 | 1.5 | 1.36 | 1.22 |
| | 1 | 0.25 | 0.37 | 0.34 | 0.3 |

Figure 5:
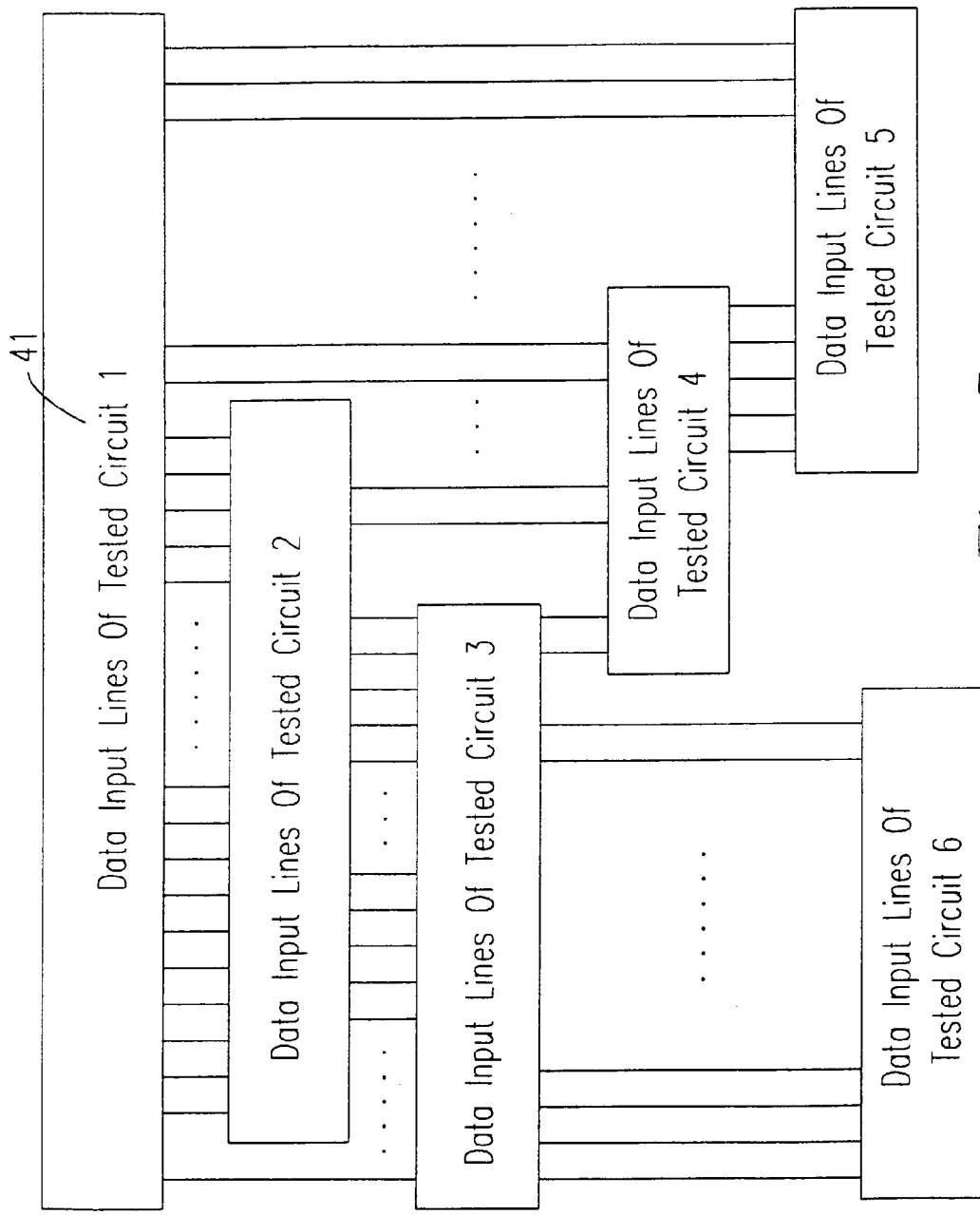
FIG. 5 is a schematic view showing a sixth architecture for implementing a test method for circuits having inputs according to the present invention.

In Table 2, row 2 (Test Efficiency, %) shows practically detectable faults in percent after deleting the redundant faults, row 3 (#Test Pattern) shows the required test pattern number, row 4 (Scan Chain Length) shows the constructed scan chain length, row 5 (Test Generation Time, sec) shows the required ATPG time, row 6 (Test Application Cycles) shows the required test clock cycle for all tested circuits to receive all test patterns, and row 7 (Normalized Test Application Cycles) shows ratios among conventional single and multiple scan chain architectures as well as three architectures utilizing a single data line for supporting multiple scan chains according to the present invention as respectively shown in FIGS. 3–5. Specifically, column 2 shows test results for the test method by utilizing the conventional single scan chain structure, column 3 shows test results for the test method by utilizing the conventional multiple scan chain structure, and columns 4, 5 and 6 respectively show test results for the test methods by utilizing architectures proposed by the present invention utilizing a single data line supporting multiple scan chains.

According to the conventional single scan chain structure, it costs 834*130=108420 clock cycles for providing all test patterns to all tested circuits where 834 is the sum of input lines of all tested circuits and 130 is the largest required test pattern number among all tested circuits. According to the conventional multiple scan chain structure, it costs 206*130=26780 clock cycles for providing all test patterns to all tested circuits. In contrast therewith, according to the present invention utilizing a single data line supporting multiple scan chains, as respectively shown in columns 4, 5 and 6 in Table 2, for the circuit combined by the same 10 ISCAS'85, it respectively only costs 195, 177 and 158 test patterns for completely detecting all detectable faults. Also, it only costs respectively 122.2, 130.3 and 115.7 seconds (excluding the pre-processing time) for proceeding the test pattern generation process. For overall test application time, the present invention as shown in FIGS. 3–5, only respectively takes 40170, 36462 and 32548 clock cycles for supplying the test pattern, which respectively are 37%, 34% and 30% of clock cycles required for the conventional single scan chain structure. On the other hand, although the proposed methods according to FIGS. 3–5 of the present invention have test times respectively being 50%, 36% and 22% more than that of the conventional multiple scan chain structure, the present invention is far more simple than the conventional multiple scan chain structure so far as the hardware structure is concerned. Furthermore, the present invention can also additionally support the peripheral scan structure.

From what is shown in the above experimental results, it can be known that test pattern number and test time required for the method 3 according to the present invention are smaller than those for methods 1 and 2. Nevertheless, the method 3 requires more virtual circuits upon the pre-processing procedure and more ATPG processes for generating the preferable test pattern. Accordingly, so far as test circuit design is concerned, an optimal result can be obtained by selecting the appropriate architecture according to the practical circuit situation and/or specification in view of the principle taught according to the present invention.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A test method for a plurality of circuits respectively having inputs comprising:
   providing a test information for detecting a characteristic of said plurality of circuits;
   providing a common data line;
   electrically connecting said common data line to said inputs of said plurality of circuits so that said test information can be broadcasted to said plurality of circuits simultaneously through said common data line;
   providing a test generation method to generate said test information, wherein said plurality of circuits are configured into a virtual circuit prior test generation procedure such that a software type automatic test pattern generator is used to generate said test information for said plurality of circuits simultaneously; and
   providing a test result compression method to compress said test results.

2. A method according to claim 1 wherein said plurality of circuits are either of a number of independent circuits and a number of independent modules in a large circuit.

3. A method according to claim 1 wherein said characteristic is a detectable fault.

4. A method according to claim 1 wherein said test information is a set of test patterns.

5. A method according to claim 1 wherein said common data line is a data input line.

6. A method according to claim 5 wherein said storage elements connecting said inputs of each circuit are connected in series to form a scan chain.

7. A method according to claim 1 wherein each of said plurality of circuits includes a plurality of input lines.

8. A method according to claim 1 wherein each of said input lines of each circuit is connected to said output of a storage element.

9. A method according to claim 8 wherein said storage element is a scan flip-flop.

10. A method according to claim 7 wherein said common data line is electrically connected to said inputs of said plurality of circuits via physically connecting said common data line to said inputs of said scan chains for said plurality of circuits.

11. A method according to claim 1 wherein said virtual circuit is formed by connecting said inputs of said plurality of circuits in a one-to-one manner.

12. A method according to claim 11 wherein said one-to-one manner is carried out by connecting one input from said each circuit to form one input of said virtual circuit, wherein all inputs of said plurality of circuits are connected to some inputs of said virtual circuit with each input of each circuit is connected to an exactly one input of said virtual circuit.

13. A method according to claim 11, said one-to-one manner is carried out by connecting said first input lines of said plurality of circuits together to form said first input of said virtual circuit, said second inputs lines of said plurality of circuits together to form said second input of said virtual circuit, and so on.

14. A method according to claim 11 wherein said virtual circuit is processed by said automatic test pattern generation procedure to generate said test information for said plurality of circuits simultaneously.

15. A method according to claim 14 wherein said test information generated through said virtual circuit has a fault coverage equal to a best fault coverage that is achieved for said respective plurality of circuits when they are tested individually.

16. A method according to claim 14 wherein required number of bits to store said test information is much smaller than that required for testing all said plurality of circuits individually.

17. A method according to claim 1 wherein said plurality of circuits outputs therethrough test result data when said test information is applied to said plurality of circuits through said common data line.

18. A method according to claim 1 wherein said test result compression method comprises a multiple input signature register electrically connected to said outputs of said plurality of circuits.

19. A method according to claim 1 wherein said test result compression method further comprises a plurality of multiple input signature registers respectively electrically connected between said outputs of said plurality of circuits.

20. A method according to claim 1 wherein said test information is broadcasted to said plurality of circuits through said common data line.

21. A test circuit architecture comprising:
   a plurality of circuits having a characteristic and input lines; and
   a common data line electrically connected to said input lines for providing therethrough a test information for detecting said characteristic of said plurality of circuits, wherein said plurality of circuits are such grouped together that the sum of said input lines of each respective group is approximate to but no larger than the number of said input lines of a specific one of said plurality of circuits having the largest input line number thereamong.

22. An architecture according to claim 21 wherein said test circuit architecture further comprises a common output line electrically connected to said plurality of circuits for obtaining output data therethrough.

23. An architecture according to claim 21 wherein said common output line outputs therethrough test result data.

24. An architecture according to claim 21 wherein said input lines of a first one of said plurality of circuits electrically connect one by one thereto said input lines of the rest of said plurality of circuits.

25. An architecture according to claim 21 wherein a test circuit architecture further comprises a plurality of scan chains respectively electrically connected between said data line and said plurality of circuits.

26. An architecture according to claim 21 wherein said input lines, of said plurality of circuits, of the same order are electrically connected together.

27. An architecture according to claim 21 wherein:
   said input lines of a first one of said plurality of circuits are respectively electrically connected one by one to said input lines of a specific one of said plurality of circuits having the largest input line number thereamong; and
   said input lines of a further one of said plurality of circuits are respectively electrically connected one by one to the rest of said input lines of said specific circuit if the number of said input lines of said further circuit is smaller than or equal to that of said rest input lines of said specific circuit, repetitively, until the number of said input lines of said further circuit is larger than that of the rest input lines of said specific circuit.

28. An architecture according to claim 21 wherein said test information is broadcasted to said plurality of circuits through said common data line.

29. An architecture according to claim 21 wherein said test information is a set of test patterns.

* * * * *